(12) United States Patent
Matsushita

(10) Patent No.: US 8,098,117 B2
(45) Date of Patent: Jan. 17, 2012

(54) LC COMPOSITE COMPONENT

(75) Inventor: Yosuke Matsushita, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 12/840,419

(22) Filed: Jul. 21, 2010

(65) Prior Publication Data

US 2010/0277255 A1    Nov. 4, 2010

Related U.S. Application Data

(63) Continuation of application No. PCT/JP2009/051478, filed on Jan. 29, 2009.

(30) Foreign Application Priority Data

Jan. 31, 2008   (JP) .................................. 2008-021016

(51) Int. Cl.
 *H03H 7/09* (2006.01)
(52) U.S. Cl. .......................... 333/185; 333/175; 333/177
(58) Field of Classification Search .................. 333/167, 333/170, 175, 177, 185
 See application file for complete search history.

(56) References Cited

U.S. PATENT DOCUMENTS

2002/0030561 A1  3/2002  Masuda et al.
2005/0017824 A1  1/2005  Hirabayashi

FOREIGN PATENT DOCUMENTS

| JP | 5-83011 A | 4/1993 |
|---|---|---|
| JP | 7-33003 U | 6/1995 |
| JP | 8-316035 A | 11/1996 |
| JP | 9-153704 A | 6/1997 |
| JP | 10-209710 A | 8/1998 |
| JP | 2003-179405 A | 6/2003 |
| JP | 3702767 B2 | 10/2005 |
| WO | 2006/022098 A1 | 3/2006 |

OTHER PUBLICATIONS

Official Communication issued in International Patent Application No. PCT/JP2009/051478, mailed on Feb. 24, 2009.

*Primary Examiner* — Robert Pascal
*Assistant Examiner* — Hardadi Sumadiwirya
(74) *Attorney, Agent, or Firm* — Keating & Bennett, LLP

(57) ABSTRACT

An LC composite component has a unique structure that makes it easy to set frequency characteristics while reducing a circuit area and the number of layers. The LC composite component includes a laminated body including a plurality of dielectric layers. The laminated body is produced by forming input and output electrodes and an LC resonant circuit therein. The LC composite component includes a capacitor, which includes an elongated electrode portion having an elongated shape. The elongated electrode portion faces a flat electrode portion having a flat shape, with one of the dielectric layers interposed therebetween. At the same time, the elongated electrode portion constitutes an open stub that is open at a tip end.

9 Claims, 5 Drawing Sheets

LC COMPOSITE COMPONENT

BACKGROUND OF THE INVENTION

1. Field of the Invention

The present invention relates to an LC composite component produced by forming input and output electrodes and an LC resonant circuit in a laminated body obtained by stacking a plurality of dielectric layers.

2. Description of the Related Art

LC composite components having a configuration in which an LC resonant circuit is formed in a laminated body obtained by stacking dielectric layers have been used. When an LC composite component serves as a high-frequency filter, a notch circuit is sometimes connected to an LC resonant circuit such that the resulting curve becomes steep at an attenuation pole (see, e.g., Japanese Unexamined Patent Application Publication No. 9-153704).

A known filter will now be described.

FIG. 1 is a circuit diagram of a filter in which notch circuits are connected to corresponding LC resonant circuits.

A coupling capacitance C5 is connected between an input terminal P1 and an output terminal P2. A first LC resonant circuit having an inductance L1 and a capacitance C1 connected in parallel is connected between the input terminal P1 and the ground terminal. A second LC resonant circuit having an inductance L2 and a capacitance C2 connected in parallel is connected between the output terminal P2 and the ground terminal. A mutual inductance M is formed between the inductance L1 and the inductance L2, so that the first and second LC resonant circuits are magnetically coupled to each other.

A notch circuit having an inductance L3 and a capacitance C3 connected in series is connected between the input terminal P1 and the ground terminal. A notch circuit having an inductance L4 and a capacitance C4 connected in series is connected between the output terminal P2 and the ground terminal.

The filter having the notch circuits therein is provided with electrodes that form the capacitances and inductances of the notch circuits, as well as electrodes that form the capacitances and inductances of the LC resonant circuits. This increases not only the circuit area by the size of the electrodes, but also the number of layers in the filter.

SUMMARY OF THE INVENTION

Preferred embodiments of the present invention provide an LC composite component that makes it easy to set frequency characteristics while reducing a circuit area.

An LC composite component according to a preferred embodiment of the present invention has a configuration in which at least one capacitor connected between input and output electrodes includes at least two electrode portions isolated from each other. The electrode portions include at least a flat electrode portion and an elongated electrode portion having an elongated shape. The elongated electrode portion faces the flat electrode portion, with a dielectric layer interposed therebetween. With this configuration, the capacitor makes it possible to adjust frequency characteristics in accordance with the shape of the elongated electrode portion while providing a capacitance necessary for a circuit configuration, so that the capacitor can be used as a dual-purpose capacitor having a frequency adjusting function. When the dual-purpose capacitor includes a flat electrode portion, it is possible to ensure a large capacitance even if an electrode facing the flat electrode portion has an elongated shape.

The elongated electrode portion is preferably an open stub that is open at a tip end. In this case, attenuation occurs at a frequency having a quarter wavelength equal to the stub length. It is thus possible to easily set frequency characteristics by adjusting the stub length.

The dual-purpose capacitor may include a plurality of counter electrodes isolated from each other and each facing the flat electrode portion with a dielectric layer interposed therebetween. For example, the dual-purpose capacitor may include first and second counter electrodes facing the flat electrode portion with a first dielectric layer interposed therebetween, and third and fourth counter electrodes facing the flat electrode portion with a second dielectric layer interposed therebetween. In this case, it is preferable that at least one of the plurality of counter electrodes be an elongated electrode portion. It is thus possible to provide an elongated electrode portion while ensuring a large capacitance.

The dual-purpose capacitor preferably includes a plurality of the elongated electrode portions, with the elongated electrode portions being different in length in a region facing the flat electrode portion. This makes it possible to provide attenuation at a plurality of frequencies in frequency characteristics.

The elongated electrode portion preferably includes a region facing the flat electrode portion and a region not facing the flat electrode portion. This makes it possible to set mainly a capacitance in the region facing the flat electrode portion, and to make fine adjustments of mainly frequency characteristics in the region not facing the flat electrode portion.

The elongated electrode portion may have a spiral shape or a meandering shape. The elongated electrode portion may be included in the capacitor connected between a plurality of LC resonant circuits, the capacitor connected between an LC resonant circuit and the input and output electrodes, or the capacitor included in the LC resonant circuit.

An LC composite component according to a preferred embodiment of the present invention has a configuration in which at least one capacitor includes an elongated electrode portion and a flat electrode portion. This makes it possible to easily set frequency characteristics in accordance with the shape of the elongated electrode portion while reducing a circuit area and the number of layers.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, LC composite components according to preferred embodiments of the present invention will be described. The LC composite component to be described here preferably is a band-pass filter including two LC parallel resonant circuits coupled to each other.

Figure 1:
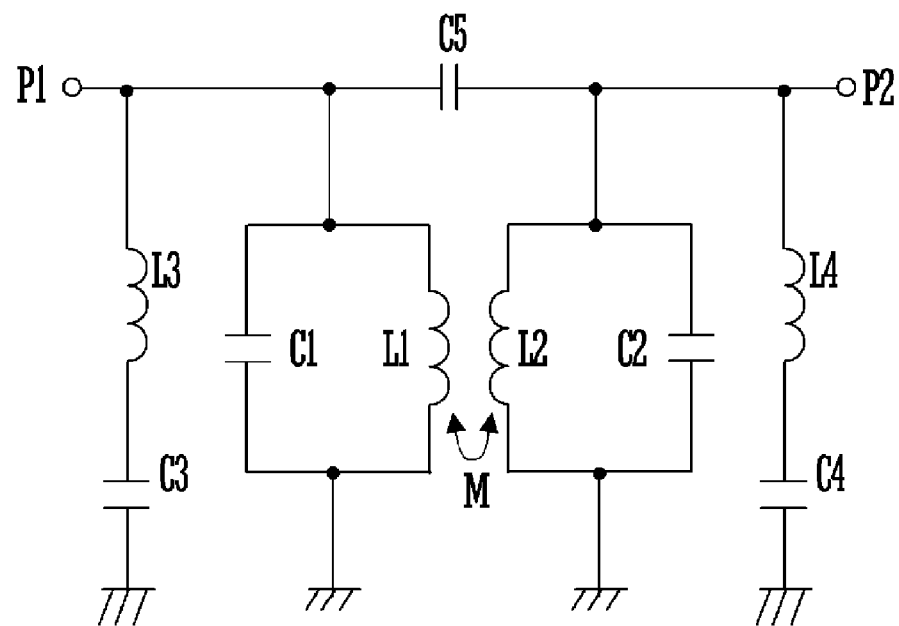
FIG. 1 is a circuit diagram of a known filter.
Figure 2:
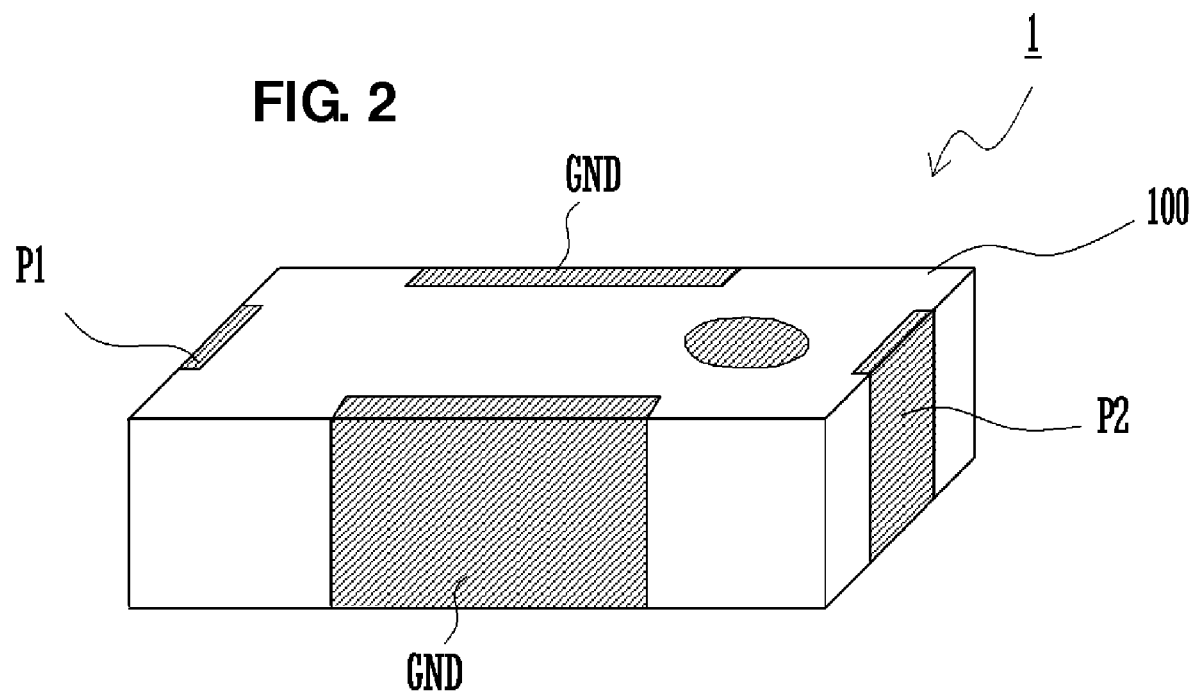
FIG. 2 is an external perspective view of an LC composite component according to a preferred embodiment of the present invention.

FIG. 2 is an external perspective view of the LC composite component.

An LC composite component 1 includes a laminated body 100. The laminated body 100 is obtained by stacking dielectric layers in a stacking direction, which is a vertical direction in the drawing. The laminated body 100 has four side surfaces perpendicular or substantially perpendicular to the stacking direction. Of the four side surfaces, two side surfaces having shorter sides are provided with an input terminal P1 and an output terminal P2, while the other two side surfaces having longer sides are provided with ground terminals GND.

Figure 3:
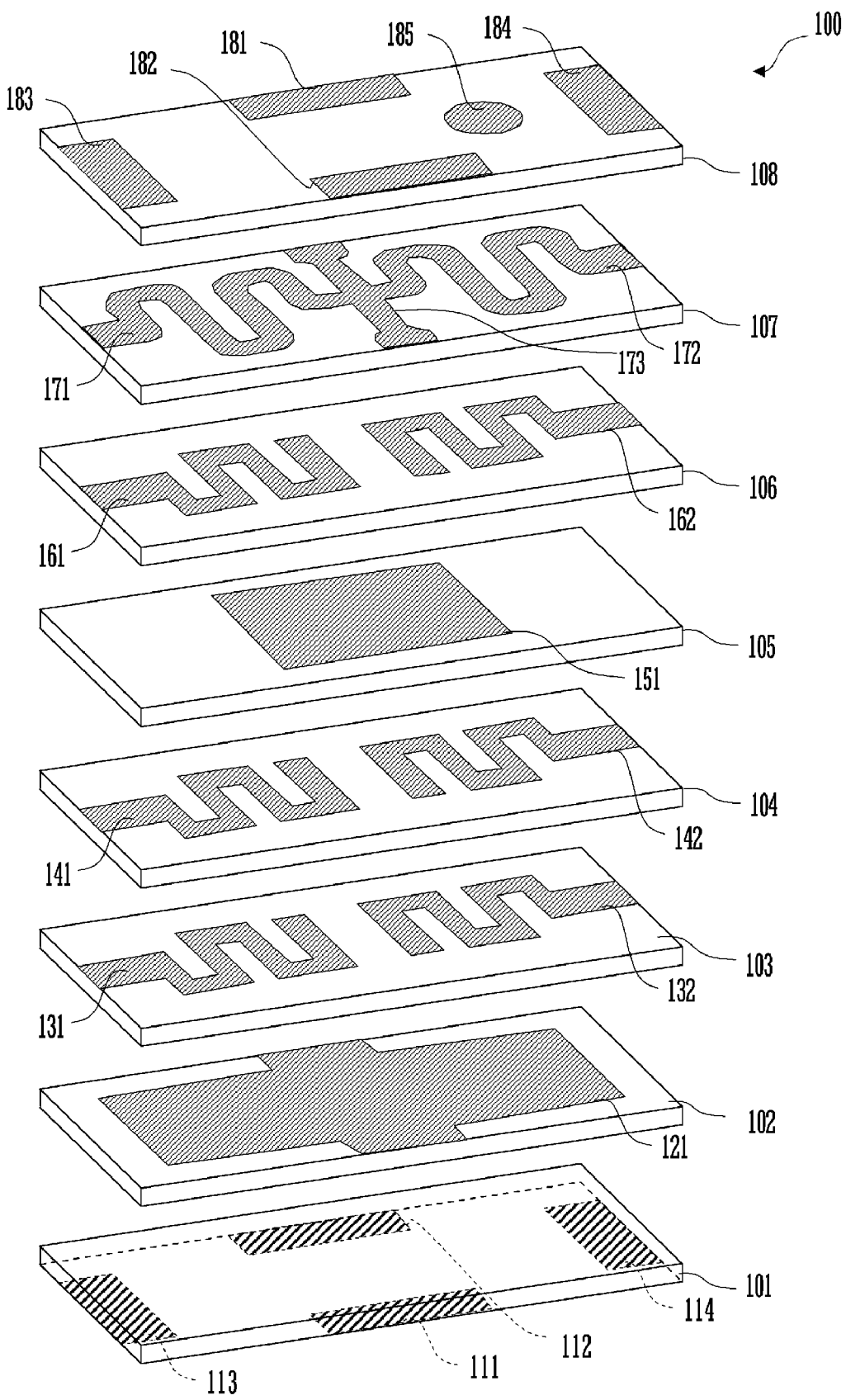
FIG. 3 is an exploded perspective view of the LC composite component.

FIG. 3 is an exploded perspective view of the filter.

The laminated body 100 includes a lower layer 101, a first flat-electrode layer 102, a first elongated-electrode layer 103, a second elongated-electrode layer 104, a second flat-electrode layer 105, a third elongated-electrode layer 106, an inductor-electrode layer 107, and an upper layer 108. The layers 101 to 108 are all dielectric layers.

The laminated body 100 preferably is a rectangular or substantially rectangular plate-shaped body having a principal surface that preferably is, for example, about 1.6 mm on the longer side and about 0.8 mm on the shorter side. The laminated body 100 preferably is made of low-temperature co-fired ceramic (LTCC) containing a glass component and at least one of such components as titanium oxide, barium oxide, and alumina.

The lower layer 101 includes lower ground electrodes 111 and 112 and lower input and output electrodes 113 and 114 disposed on the lower surface thereof. The lower ground electrodes 111 and 112 constitute respective portions of the ground terminals GND. The lower input and output electrodes 113 and 114 constitute respective portions of the input and output terminals P1 and P2.

The first flat-electrode layer 102 includes a flat electrode portion 121 disposed on the upper surface thereof. In the flat electrode portion 121, an extraction electrode is extracted from substantially the center of the longer sides of the laminated body 100. The flat electrode portion 121 is connected, at this extraction electrode, to the ground terminals GND provided on the side surfaces of the laminated body 100.

The first elongated-electrode layer 103 includes elongated electrode portions 131 and 132 provided on the upper surface thereof. The elongated electrode portions 131 and 132 preferably are meandering electrodes, each of which is open at its tip end near the center of the upper surface of the layer 103 and is extended at its base end to the center of the corresponding short side of the layer 103. The elongated electrode portions 131 and 132 are connected, at their base ends, to the input and output terminals P1 and P2, respectively.

The elongated electrode portions 131 and 132 and the flat electrode portion 121 face each other, with the layer 103 (dielectric layer) interposed therebetween, to form capacitances C1 and C2. Here, the flat electrode portion 121 is disposed opposite to the elongated electrode portions 131 and 132. Therefore, although the elongated electrode portions 131 and 132 have an elongated shape, it is possible to ensure a large capacitance. The elongated electrode portions 131 and 132 each serve as an open stub that provides attenuation, in frequency characteristics, at a frequency having a quarter wavelength equal to the stub length.

The second long-electrode layer 104 includes elongated electrode portions 141 and 142 disposed on the upper surface thereof. The elongated electrode portions 141 and 142 preferably are meandering electrodes, each of which is open at its tip end near the center of the upper surface of the layer 104 and is extended at its base end to the center of the corresponding short side of the layer 104. The elongated electrode portions 141 and 142 are connected, at their base ends, to the input and output terminals P1 and P2, respectively.

The elongated electrode portions 131 and 132 and the elongated electrode portions 141 and 142 face each other, with the layer 104 (dielectric layer) interposed therebetween. Since the elongated electrode portions 131 and 132 and the elongated electrode portions 141 and 142 are connected to the input and output terminals P1 and P2 and are at the same potential, no capacitance is formed therebetween.

The second flat-electrode layer 105 includes a flat electrode portion 151 disposed on the upper surface thereof. The flat electrode portion 151 is disposed at substantially the center of the upper surface of the laminated body 100 such that it is spaced apart from the side surfaces of the laminated body 100.

The third long-electrode layer 106 includes elongated electrode portions 161 and 162 disposed on the upper surface thereof. The elongated electrode portions 161 and 162 preferably are meandering electrodes, each of which is open at its tip end near the center of the upper surface of the layer 106 and is extended at its base end to the center of the corresponding short side of the layer 106. The elongated electrode portions 161 and 162 are connected, at their base ends, to the input and output terminals P1 and P2, respectively.

The elongated electrode portions 141, 142, 161, and 162 and the flat electrode portion 151 face each other, with the layers 105 and 106 (dielectric layers) interposed therebetween, to form a coupling capacitance C5. Since the flat electrode portion 151 is disposed opposite the plurality of elongated electrode portions 141, 142, 161, and 162, it is possible to ensure a large capacitance. The elongated electrode portions 141, 142, 161, and 162 each serve as an open stub that provides attenuation, in frequency characteristics, at a frequency having a quarter wavelength equal to the stub length.

The inductor-electrode layer 107 includes inductor electrode portions 171 and 172 and an extraction electrode portion 173 disposed on the upper surface thereof. The inductor electrode portions 171 and 172 preferably are meandering electrodes, each of which is connected to the extraction electrode portion 173 at its tip end near the center of the upper surface of the layer 107 and is extended at its base end to the center of the corresponding short side of the layer 107. The inductor electrode portions 171 and 172 are connected, at their base ends, to the input and output terminals P1 and P2, respectively. The extraction electrode portion 173 is a linear electrode, whose both ends are extended to the respective centers of the longer sides of the layer 107 and connected to the corresponding ground terminals GND. The inductor electrode portions 171 and 172 form inductances L1 and L2, respectively.

The upper layer 108 includes upper ground electrodes 181 and 182, upper input and output electrodes 183 and 184, and a marker 185 located on the upper surface thereof. The upper ground electrodes 181 and 182 constitute portions of the ground terminals GND. The upper input and output electrodes 183 and 184 constitute portions of the input and output terminals P1 and P2, respectively. The marker 185 is provided for visual identification of the orientation of the laminated body.

The LC composite component 1 preferably has the unique structure described above.

In the drawing, the elongated electrode portions 131, 132, 141, 142, 161, and 162 are illustrated as having the same stub length, for example. If their stub lengths are made different from each other, it is possible to provide attenuation at a plurality of frequencies having quarter wavelengths equal to the stub lengths of open stubs defined by the elongated electrode portions 131, 132, 141, 142, 161, and 162. Here, the electrodes 131, 132, 141, 142, 161, and 162 preferably are all formed as elongated electrode portions, for example. However, as long as at least one of the electrodes 131, 132, 141, 142, 161, and 162 is an elongated electrode portion, the present invention can be preferably carried out even if the other electrodes are formed as flat electrode portions. The flat electrode portions 121 and 151 may be formed as elongated electrode portions that face each other to form a capacitance therebetween.

Figure 4A:
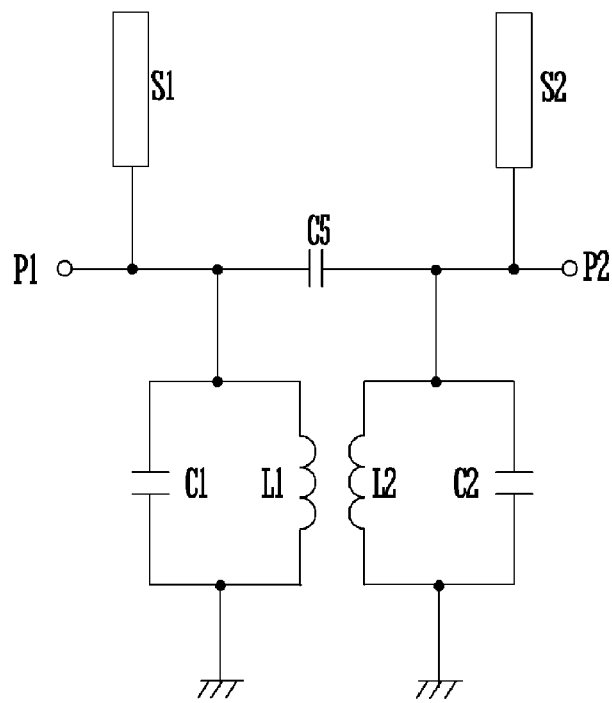
FIGS. 4A and 4B illustrate the LC composite component.
Figure 4B:
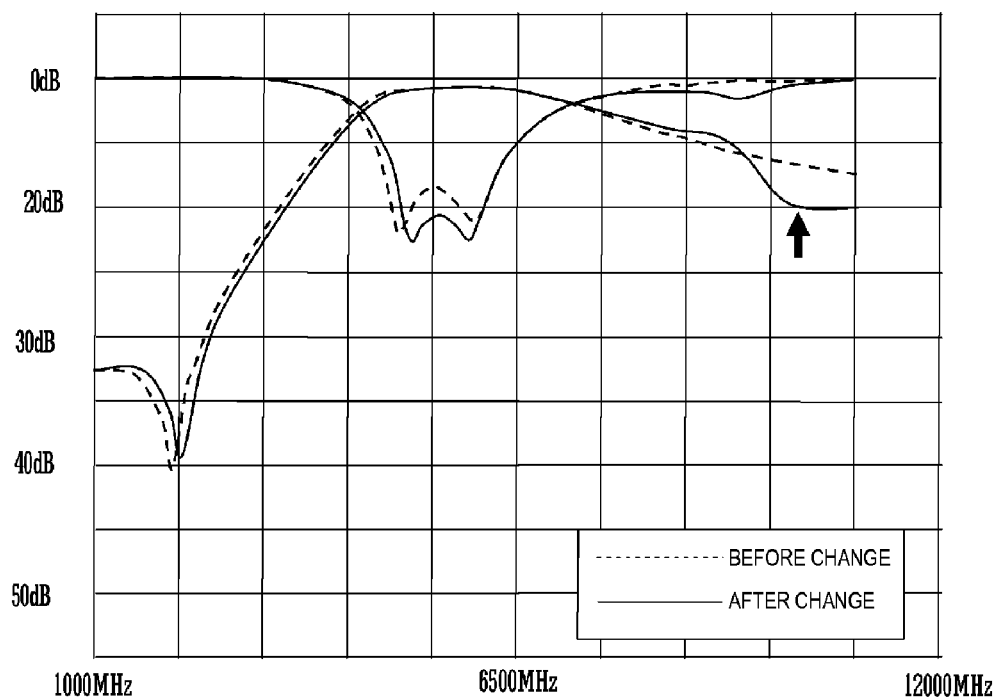

FIGS. 4A and 4B illustrate the LC composite component. FIG. 4A is an equivalent circuit diagram of the LC composite component. FIG. 4B shows exemplary frequency characteristics of the LC composite component.

The coupling capacitance C5 is connected between the input terminal P1 and the output terminal P2. One end of a first LC resonant circuit having the inductance L1 and the capacitance C1 connected in parallel is connected between the input terminal P1 and the coupling capacitance C5. One end of a second LC resonant circuit having the inductance L2 and the capacitance C2 connected in parallel is connected between the output terminal P2 and the coupling capacitance C5. The other ends of the first and second LC resonant circuits are connected to the ground terminal. An open stub S1 is connected to the input terminal P1. An open stub S2 is connected to the output terminal P2.

The open stub S1 preferably is a stub defined by the elongated electrode portions 131, 141, and 161, while the open stub S2 is a stub defined by the elongated electrode portions 132, 142, and 162. Thus, by providing open stubs in the filter circuit, attenuation occurs at a frequency having a quarter wavelength equal to the stub length. Therefore, adjusting the stub length makes it easy to set frequency characteristics, which are filter characteristics here. Without providing a notch circuit or increasing the number of stages of a resonator, adjusting the stub length makes it possible to improve attenuation characteristics in any frequency band, such as the second or third harmonic, as indicated by an arrow in the graph of FIG. 4B.

Exemplary shapes of elongated electrode portions will now be described. Although exemplary shapes of the elongated electrode portions 131 and 132 on the dielectric layer 103 will be described here, similar shapes can be adopted as those of the elongated electrode portions 141, 142, 161, and 162.

Figure 5A:
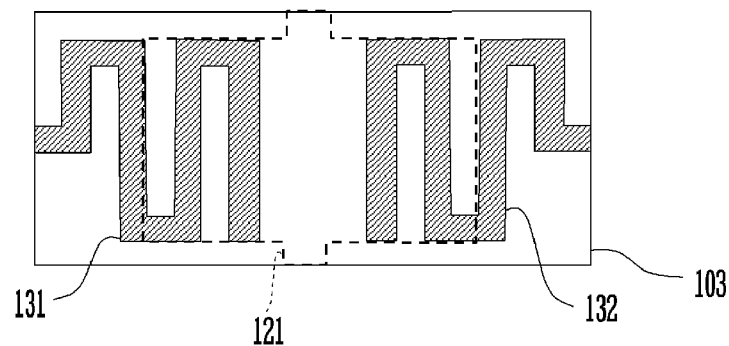
FIGS. 5A-5D illustrate modified elongated electrode portions for the LC composite component.
Figure 5B:
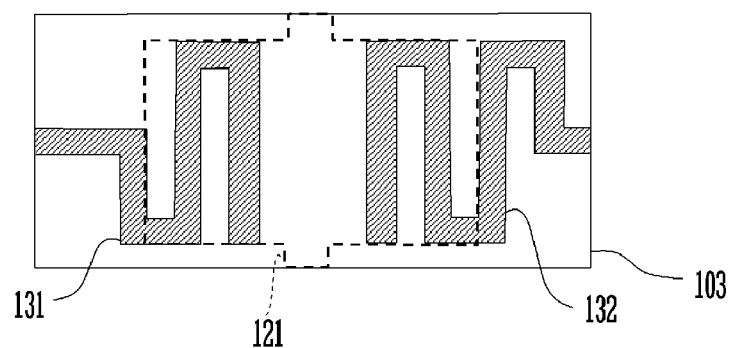

FIGS. 5A and 5B are plan views of the dielectric layer 103.

FIG. 5A illustrates an example in which the elongated electrode portions 131 and 132 that are symmetrical with respect to a line are disposed on the upper surface of the dielectric layer 103. The elongated electrode portions 131 and 132 each preferably are a meandering electrode having three turns. The flat electrode portion 121 on the upper surface of the dielectric layer 102 (not shown) is disposed on the lower surface of the dielectric layer 103.

The elongated electrode portions 131 and 132 are arranged such that they partially do not overlap with the flat electrode portion 121. Therefore, while mainly a capacitance is set in a region where the flat electrode portion 121 and the elongated electrode portions 131 and 132 face each other, a fine adjustment of mainly a stub length can be made in a region where the elongated electrode portions 131 and 132 and the flat electrode portion 121 do not face each other. The meandering shape of the elongated electrode portions 131 and 132 has an effect of preventing easy occurrence of unnecessary coupling between input and output terminals.

FIG. 5B illustrates an example in which the elongated electrode portions 131 and 132 have different stub lengths. The elongated electrode portion 131 preferably is a meandering electrode having two turns, while the elongated electrode portion 132 preferably is a meandering electrode having three turns.

In the example of FIG. 5B, the elongated electrode portions 131 and 132 are similar in shape in a region where the flat electrode portion 121 and the elongated electrode portions 131 and 132 face each other, but have different shapes in a region where the elongated electrode portions 131 and 132 and the flat electrode portion 121 do not face each other. Thus, a capacitance formed between the elongated electrode portion 131 and the flat electrode portion 121 is the same as that formed between the elongated electrode portion 132 and the flat electrode portion 121, but the stub length of the elongated electrode portion 131 is different from that of the elongated electrode portion 132.

Figure 5C:
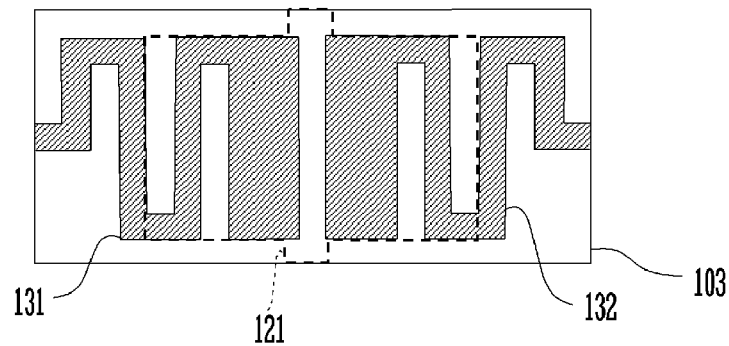

FIG. 5C illustrates an example in which the elongated electrode portions 131 and 132 each includes tip ends and base ends with different line widths. The elongated electrode portions 131 and 132 preferably are meandering electrodes each having three turns.

In the example of FIG. 5C, in a region where the flat electrode portion 121 and the elongated electrode portions 131 and 132 face each other, the elongated electrode portions 131 and 132 each include a tip end with a wider line width. This increases a capacitance formed between the elongated electrode portions 131 and 132 and the flat electrode portion 121, and makes it possible to adjust an impedance of the elongated electrode portions 131 and 132.

Figure 5D:
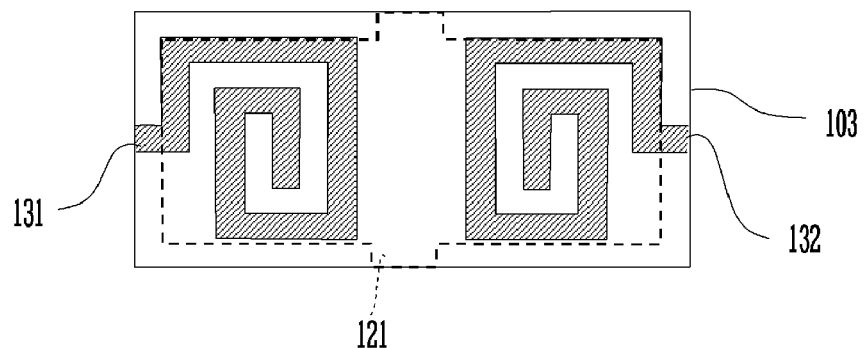

FIG. 5D illustrates an example in which the elongated electrode portions 131 and 132 each are formed in a spiral shape. Preferred embodiments of the present invention can thus be carried out even when the elongated electrode portions 131 and 132 do not have a meandering shape.

Exemplary shapes of elongated electrode portions will now be described using electrodes disposed on the dielectric layers 104, 105, and 106 as examples.

Figure 6:
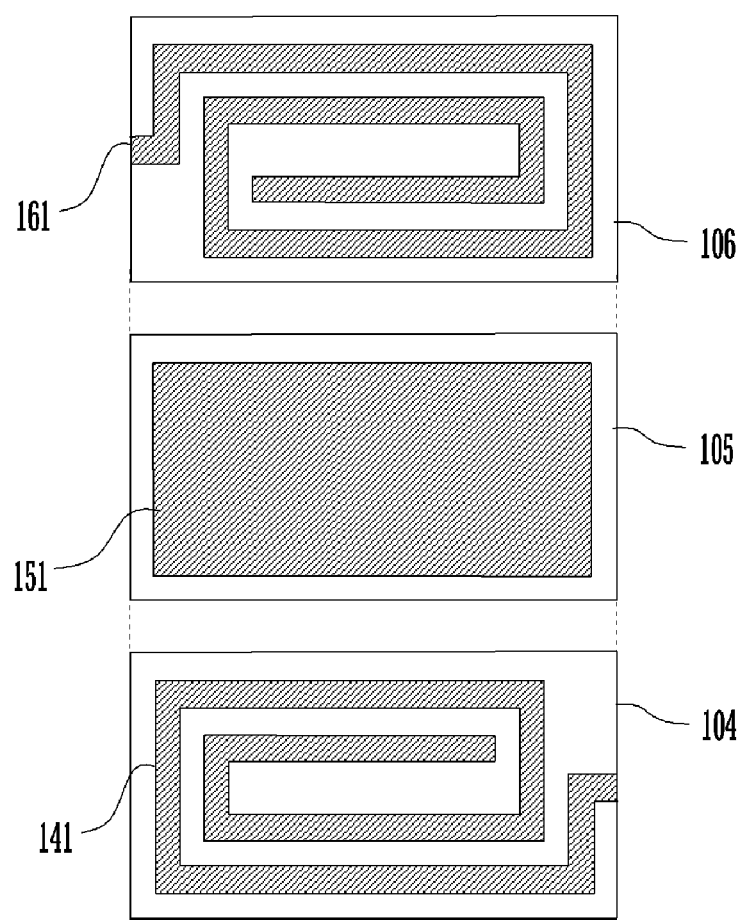
FIG. 6 illustrates modified elongated electrode portions for the LC composite component.

FIG. 6 is a stacking diagram of the dielectric layers 104 to 106.

The dielectric layers 104 and 106 are provided with the elongated electrode portions 141 and 161, respectively. The dielectric layer 105 is provided with the flat electrode portion 151. The elongated electrode portions 141 and 161 each preferably have a spiral shape.

Thus, the electrodes on the plurality of dielectric layers form capacitances and make it possible to provide a large capacitance.

Figure 7:
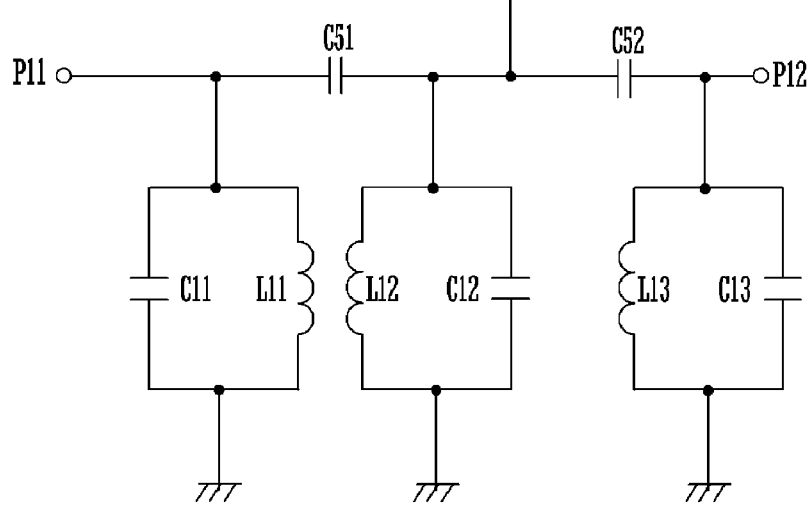
FIG. 7 is another equivalent circuit diagram of the LC composite component according to a preferred embodiment of the present invention.

FIG. 7 is a circuit diagram illustrating another circuit configuration of the LC composite component.

Coupling capacitances C51 and C52 are connected in this order between an input terminal P11 and an output terminal P12. One end of a first LC resonant circuit having an inductance L11 and a capacitance C11 connected in parallel is connected between the input terminal P11 and the coupling capacitance C51. One end of a second LC resonant circuit having an inductance L12 and a capacitance C12 connected in parallel is connected between the coupling capacitance C51 and the coupling capacitance C52. One end of a third LC resonant circuit having an inductance L13 and a capacitance C13 connected in parallel is connected between the output terminal P12 and the coupling capacitance C52. The other ends of the first to third LC resonant circuits are connected to the ground terminal. An open stub S11 is connected between the coupling capacitance C51 and the coupling capacitance C52.

At least one of the capacitances C11 to C13 includes an elongated electrode portion, which serves as the open stub S11. With such a configuration, an open stub is provided in the filter circuit, so that attenuation occurs at a frequency having a quarter wavelength equal to the stub length. Therefore, adjusting the stub length makes it easy to set frequency characteristics. Without providing a notch circuit or increasing the number of stages of a resonator, adjusting the stub length makes it possible to improve attenuation characteristics in any frequency band, such as the second or third harmonic.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An LC composite component comprising:
   input and output electrodes; and
   an LC resonant circuit disposed in a laminated body including a plurality of dielectric layers; wherein
   at least one capacitor connected between the input and output electrodes includes at least two electrode portions isolated from each other;
   the at least two electrode portions include at least a flat electrode portion and an elongated electrode portion having an elongated shape, the elongated electrode portion facing the flat electrode portion with one of the dielectric layers interposed therebetween; and
   the elongated electrode portion has one of a spiral shape or a meandering shape.

2. The LC composite component according to claim 1, wherein the elongated electrode portion is an open stub that is open at a tip end.

3. The LC composite component according to claim 1, wherein the at least one capacitor includes a plurality of counter electrodes isolated from each other and each facing the flat electrode portion with one of the dielectric layers interposed therebetween, and at least one of the plurality of counter electrodes is the elongated electrode portion.

4. The LC composite component according to claim 3, wherein the at least one capacitor includes the flat electrode portion, first and second counter electrodes facing the flat electrode portion with a first dielectric layer interposed therebetween, and third and fourth counter electrodes facing the flat electrode portion with a second of the dielectric layers interposed therebetween.

5. The LC composite component according to claim 3, wherein the at least one capacitor includes a plurality of the elongated electrode portions, the elongated electrode portions being different in length in a region facing the flat electrode portion.

6. The LC composite component according to claim 1, wherein the elongated electrode portion includes a portion facing the flat electrode portion and a portion not facing the flat electrode portion.

7. The LC composite component according to claim 1, wherein a plurality of the LC resonant circuits is provided; and
   the at least two isolated electrode portions of the at least one capacitor are connected between the plurality of LC resonant circuits.

8. The LC composite component according to claim 1, wherein the at least two isolated electrode portions of the at least one capacitor are connected between the LC resonant circuit and the input and output electrodes.

9. The LC composite component according to claim 1, wherein the at least one capacitor is included in the LC resonant circuit.

* * * * *